United States Patent
Heo et al.

(10) Patent No.: US 11,325,222 B2
(45) Date of Patent: May 10, 2022

(54) POROUS POLYURETHANE POLISHING PAD AND METHOD FOR MANUFACTURING SAME

(71) Applicant: SKC solmics Co., Ltd., Gyeonggi-do (KR)

(72) Inventors: Hye Young Heo, Gyeonggi-do (KR); Jang Won Seo, Busan (KR); Hyuk Hee Han, Gyeonggi-do (KR)

(73) Assignee: SKC solmics Co., Ltd., Gyeonggi-do (KR)

( * ) Notice: Subject to any disclaimer, the term of this patent is extended or adjusted under 35 U.S.C. 154(b) by 263 days.

(21) Appl. No.: 16/462,180

(22) PCT Filed: Jan. 9, 2018

(86) PCT No.: PCT/KR2018/000415
§ 371 (c)(1),
(2) Date: May 17, 2019

(87) PCT Pub. No.: WO2018/131868
PCT Pub. Date: Jul. 19, 2018

(65) Prior Publication Data
US 2019/0329376 A1   Oct. 31, 2019

(30) Foreign Application Priority Data

Jan. 12, 2017   (KR) .................. 10-2017-0005301

(51) Int. Cl.
| | | |
|---|---|---|
| *B24B 37/24* | (2012.01) | |
| *B29C 44/02* | (2006.01) | |
| *C08G 18/08* | (2006.01) | |
| *C08G 18/10* | (2006.01) | |
| *C08G 18/48* | (2006.01) | |
| *C08G 18/76* | (2006.01) | |
| *C08J 9/00* | (2006.01) | |
| *C08J 9/38* | (2006.01) | |
| *C08K 5/17* | (2006.01) | |
| *C08K 5/35* | (2006.01) | |
| *C08L 75/04* | (2006.01) | |
| *H01L 21/304* | (2006.01) | |
| *H01L 21/3105* | (2006.01) | |
| *H01L 21/321* | (2006.01) | |
| *C08G 101/00* | (2006.01) | |

(52) U.S. Cl.
CPC .............. *B24B 37/24* (2013.01); *B29C 44/02* (2013.01); *C08G 18/10* (2013.01); *C08G 18/14* (2013.01); *C08K 5/17* (2013.01); *C08K 5/35* (2013.01); *C08G 2101/00* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 10,513,007 | B2 * | 12/2019 | Ahn ................... | H01L 21/3212 |
| 10,518,383 | B2 * | 12/2019 | Ahn ................... | B24D 3/32 |
| 2006/0226567 | A1 * | 10/2006 | James ................. | B29B 7/726 |
| | | | | 264/45.4 |
| 2009/0137120 | A1 * | 5/2009 | Huang ................. | B24D 11/00 |
| | | | | 438/692 |
| 2010/0035529 | A1 * | 2/2010 | Kulp .................. | B24D 3/32 |
| | | | | 451/540 |
| 2015/0065014 | A1 * | 3/2015 | Jensen ................ | B24B 37/205 |
| | | | | 451/41 |
| 2016/0176013 | A1 * | 6/2016 | Qian .................. | C08G 18/758 |
| | | | | 51/296 |
| 2017/0014970 | A1 * | 1/2017 | Itoyama ............. | C08G 18/4854 |
| 2018/0345448 | A1 * | 12/2018 | Weis ................... | B24B 37/22 |
| 2019/0061097 | A1 * | 2/2019 | Seo .................... | C08G 18/7671 |
| 2019/0321937 | A1 * | 10/2019 | Heo ................... | C08J 9/122 |
| 2021/0094144 | A1 * | 4/2021 | Ahn ................... | C08G 18/10 |

FOREIGN PATENT DOCUMENTS

| | | |
|---|---|---|
| JP | 2009-117815 A | 5/2009 |
| JP | 2010-135493 | 6/2010 |
| JP | 2015-134402 A1 | 7/2015 |
| KR | 10-0804275 | 2/2008 |
| KR | 10-2009-0078846 | 7/2009 |
| KR | 10-2010-0101565 | 9/2010 |
| KR | 10-1186531 | 10/2012 |
| KR | 10-1608901 | 4/2016 |
| TW | 200639019 | 11/2006 |
| WO | 95/30711 A1 | 11/1995 |
| WO | WO-2015151784 A1 * | 8/2015 |

OTHER PUBLICATIONS

Office Action issued by Japanese Patent Office dated Aug. 25, 2020.
Argin, M. et al., Characterization of Polyurethane Foam Dielectric Strength, IEEE Transactions on Dielectrics and Electrical Insulation, Apr. 2008, pp. 350-356, vol. 15, No. 2, Arizona, USA.
Office Action issued by the Taiwanese Intellectual Property Office dated Jul. 19, 2019.

* cited by examiner

*Primary Examiner* — Melissa A Rioja
(74) *Attorney, Agent, or Firm* — IP & T Group LLP

(57) ABSTRACT

An embodiment relates to a porous polyurethane polishing pad for use in a chemical mechanical planarization (CMP) process of semiconductors and a process for preparing the same. In the porous polyurethane polishing pad, the polishing performance (or polishing rate) thereof can be controlled by adjusting the size and distribution of pores in the polishing pad.

11 Claims, 2 Drawing Sheets

[Fig. 1]
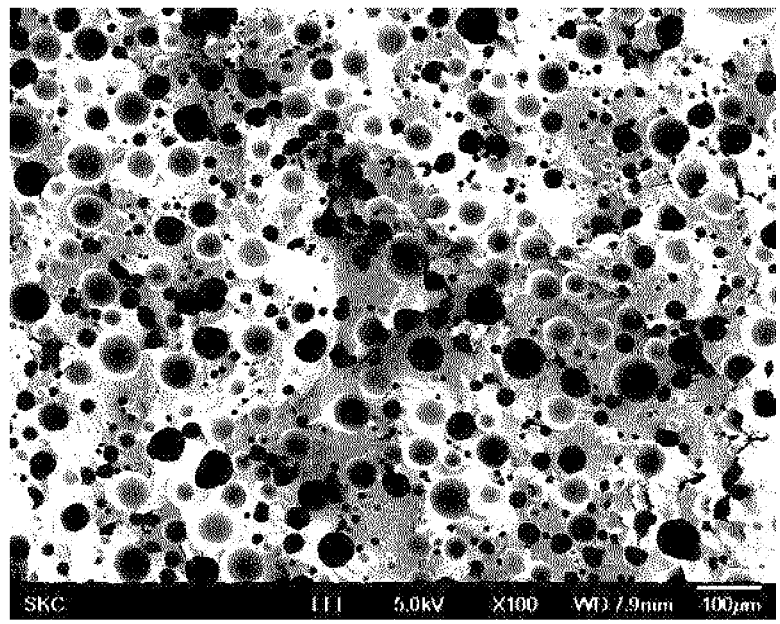
[Fig. 2]
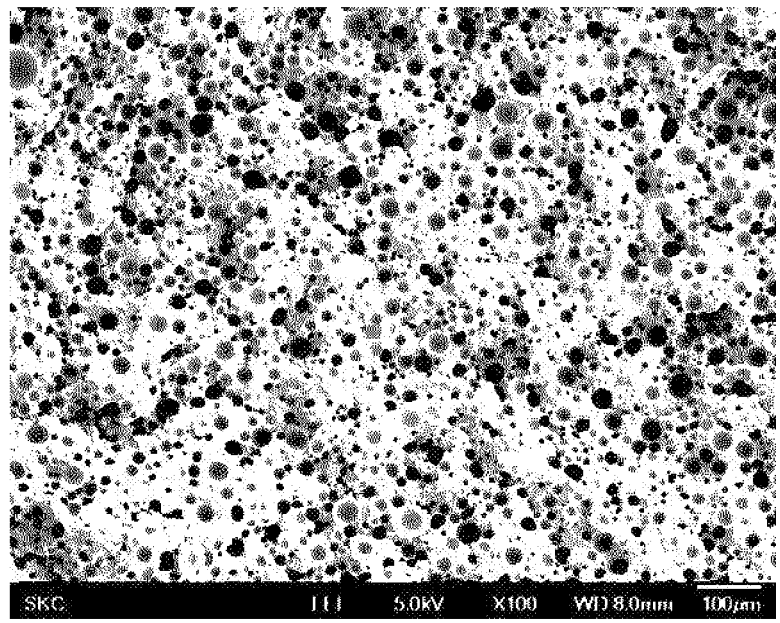

[Fig. 3]
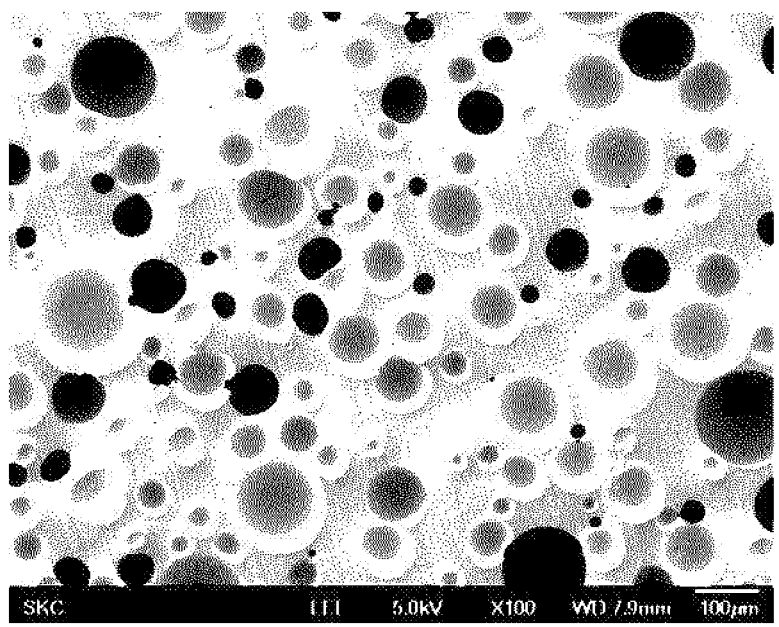
[Fig. 4]
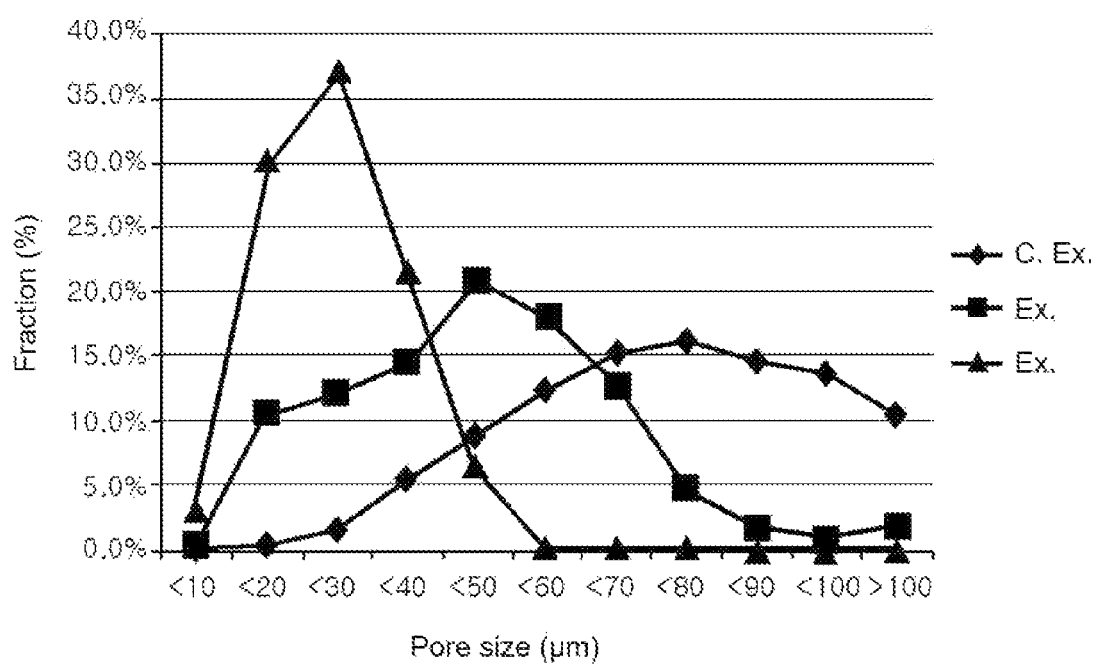

POROUS POLYURETHANE POLISHING PAD AND METHOD FOR MANUFACTURING SAME

This application is a national stage application of PCT/KR2018/000415 filed on Jan. 9, 2018, which claims priority of Korean patent application number 10-2017-0005301 filed on Jan. 12, 2017. The disclosure of each of the foregoing applications is incorporated herein by reference in its entirety.

TECHNICAL FIELD

An embodiment relates to a porous polyurethane polishing pad for use in a chemical mechanical planarization (CMP) process of semiconductors and a process for preparing the same.

BACKGROUND ART

The chemical mechanical planarization (CMP) process in a process for preparing semiconductors refers to a step in which a wafer is fixed to a head and in contact with the surface of a polishing pad mounted on a platen, and the wafer is then chemically treated by supplying a slurry while the platen and the head are relatively moved to thereby mechanically planarize the irregularities on the wafer surface.

A polishing pad is an essential member that plays an important role in such a CMP process. In general, a polishing pad is made of a polyurethane-based resin and has grooves on its surface for a large flow of a slurry and pores for supporting a fine flow thereof.

The pores in a polishing pad may be formed by using a solid phase foaming agent having voids, a liquid phase foaming agent filled with a volatile liquid, an inert gas, a fiber, or the like, or by generating a gas by a chemical reaction.

The technique of forming pores using an inert gas or a volatile liquid phase foaming agent has the advantage that any material that may affect the CMP process is not discharged. However, it is difficult to precisely control the diameter of pores and the density of the pad since it is inevitable to deal with a gas phase, which is not conveniently controlled. It is particularly difficult to produce uniform pores of 50 µm or less. In addition, there is a problem that it is very difficult to control the diameter of pores and the density of the pad without changing the composition of the polyurethane matrix of the polishing pad.

As the solid phase foaming agent, microcapsules (i.e., thermally expanded microcapsules), whose size has been adjusted by a thermal expansion, are used. Since the thermally expanded microcapsules in a structure of already expanded micro-balloons have a uniform particle diameter, the diameter of pores can be uniformly controlled. For example, Korean Patent No. 1608901 discloses a polishing pad, which comprises pores having a uniform diameter formed by using a solid phase foaming agent. However, the thermally expanded microcapsules have a disadvantage in that it is difficult to control the pores to be formed since the shape of the microcapsules changes under the reaction condition of a high temperature of 100° C. or higher.

Accordingly, although pores can be formed in conformation with the size and distribution as designed when micropores are implemented using a single method as in the conventional processes, the degree of freedom in designing the pores is low, and there is a limit in controlling the pore distribution.

PRIOR ART DOCUMENT

Patent Document (Patent 1) Koreans Patent No. 10-1608901

DISCLOSURE OF INVENTION

Technical Problem

Accordingly, it is an object of the embodiment to provide a porous polyurethane polishing pad having pores whose size and distribution are controlled and a process for preparing the same.

Solution to Problem

In order to achieve the above object, an embodiment provides a porous polyurethane polishing pad, which comprises a urethane-based prepolymer and a curing agent, and has a thickness of 1.5 to 2.5 mm, an average pore diameter of 10 to 40 µm, a specific gravity of 0.7 to 0.9 g/cm$^3$, a surface hardness at 25° C. of 50 to 65 Shore D, a tensile strength of 15 to 25 N/mm$^2$, an elongation of 80 to 250%, a total area of pores of 30 to 60% based on the total area of the polishing pad, and a breakdown voltage of 14 to 23 kV.

In order to achieve another object, an embodiment provides a process for preparing a porous polyurethane polishing pad, which comprises (1) injecting a mixture comprising a urethane-based prepolymer, a curing agent, and a solid phase foaming agent into a mold and molding the mixture; and (2) curing the mixture, wherein the solid phase foaming agent is employed in an amount of 0.5 to 10 parts by weight based on 100 parts by weight of the urethane-based prepolymer, and the porous polyurethane polishing pad has a thickness of 1.5 to 2.5 mm, an average pore diameter of 10 to 40 µm, a specific gravity of 0.7 to 0.9 g/cm$^3$, a surface hardness at 25° C. of 50 to 65 Shore D, a tensile strength of 15 to 25 N/mm$^2$, an elongation of 80 to 250%, a total area of pores of 30 to 60% based on the total area of the polishing pad, and a breakdown voltage of 14 to 23 kV.

Advantageous Effects of Invention

In the porous polyurethane polishing pad according to the embodiment, the size and distribution of the pores can be adjusted, whereby the polishing performance (i.e., polishing rate) of the polishing pad can be controlled. Particularly, the polishing pad has pores of a relatively large pore diameter uniformly arranged over the entire polishing pad and small pores arranged between the large pores. Thus, the polishing pad has a structure in which void spaces formed by the pores and a polyurethane matrix are uniformly distributed. As a result, the polishing pad hardly has a region having a lot of pores and a region having almost no pores. Thus, the polishing pad can prevent scratches or the like that may be generated on a polished object such as a wafer.

BRIEF DESCRIPTION OF DRAWINGS

FIG. 1 is an SEM photograph of the polishing pad of Example 1.

FIG. 2 is an SEM photograph of the polishing pad of Example 2.

FIG. 3 is an SEM photograph of the polishing pad of Comparative Example 1.

FIG. 4 is a graph showing the pore diameter distribution of the polishing pads of Examples 1 and 2 and that of Comparative Example 1.

BEST MODE FOR CARRYING OUT THE INVENTION

An embodiment provides a process for preparing a porous polyurethane polishing pad, which comprises:

(1) injecting a mixture comprising a urethane-based prepolymer, a curing agent, and a solid phase foaming agent into a mold and molding the mixture; and (2) curing the mixture, wherein the solid phase foaming agent is employed in an amount of 0.5 to 10 parts by weight based on 100 parts by weight of the urethane-based prepolymer, and the porous polyurethane polishing pad has a thickness of 1.5 to 2.5 mm, an average pore diameter of 10 to 40 µm, a specific gravity of 0.7 to 0.9 g/cm$_3$, a surface hardness at 25° C. of 50 to 65 Shore D, a tensile strength of 15 to 25 N/mm$^2$, an elongation of 80 to 250%, a total area of pores of 30 to 60% based on the total area of the polishing pad, and a breakdown voltage of 14 to 23 kV.

Supply of Raw Materials

A prepolymer generally refers to a polymer having a relatively low molecular weight wherein the degree of polymerization is adjusted to an intermediate level so as to conveniently mold a molded article finally produced in the process of preparing the same. A prepolymer may be molded by itself or after a reaction with another polymerizable compound. For example, a prepolymer may be prepared by reacting an isocyanate compound with a polyol.

For example, the isocyanate compound that may be used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenyl methane diisocyanate, hexamethylene diisocyanate, dicyclohexylmethane diisocyanate, and isophorone diisocyanate.

For example, the polyol that may be used in the preparation of the urethane-based prepolymer may be at least one polyol selected from the group consisting of a polyether polyol, a polyester polyol, a polycarbonate polyol, and an acryl polyol. The polyol may have a weight average molecular weight (Mw) of 300 to 3,000 g/mol.

The urethane-based prepolymer may have a weight average molecular weight of 500 to 3,000 g/mol. Specifically, the urethane-based prepolymer may have a weight average molecular weight (Mw) of 600 to 2,000 g/mol or 800 to 1,500 g/mol.

As an example, the urethane-based prepolymer may be a polymer polymerized from toluene diisocyanate as the isocyanate compound and polytetramethylene ether glycol as the polyol and having a weight average molecular weight (Mw) of 500 to 3,000 g/mol.

The curing agent may comprise at least one selected from the group consisting of an amine compound and an alcohol compound. Specifically, the curing agent may be at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine, diaminodiphenyl methane, diaminodiphenyl sulphone, m-xylylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

The solid phase foaming agent is thermally expanded microcapsules and may have a structure of micro-balloons having an average particle diameter of 5 to 200 µm. Specifically, the solid phase foaming agent may have an average particle diameter of 10 to 50 µm. More specifically, the solid phase foaming agent may have an average particle diameter of 15 to 45 µm. In addition, the thermally expanded microcapsules may be obtained by thermally expanding thermally expandable microcapsules.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic copolymer. Furthermore, the foaming agent encapsulated inside may be at least one selected from the group consisting of hydrocarbons having 1 to 7 carbon atoms. Specifically, the foaming agent encapsulated inside may be selected from the group consisting of a low molecular weight hydrocarbon such as ethane, ethylene, propane, propene, n-butane, isobutane, butene, isobutene, n-pentane, isopentane, neopentane, n-hexane, heptane, petroleum ether, and the like; a chlorofluorohydrocarbon such as trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and the like; and a tetraalkylsilane such as tetramethylsilane, trimethylethylsilane, trimethylisopropylsilane, trimethyl-n-propylsilane, and the like.

The solid phase foaming agent may be employed in an amount of 0.5 to 10 parts by weight, 1 to 3 parts by weight, 1.3 to 2.7 parts by weight, or 1.3 to 2.6 parts by weight, based on 100 parts by weight of the urethane-based prepolymer.

In the step (1), an inert gas may be fed into the mold when the mixture is injected into the mold. The inert gas may be added while the urethane-based prepolymer, the curing agent, and the solid phase foaming agent are mixed and reacted, to thereby form pores in the polishing pad.

The kind of the inert gas is not particularly limited as long as it is a gas that does not participate in the reaction between the prepolymer and the curing agent. For example, the inert gas may be at least one selected from the group consisting of nitrogen gas ($N_2$), argon gas (Ar), and helium (He). Specifically, the inert gas may be nitrogen gas ($N_2$) or argon gas (Ar).

The inert gas may be fed in a volume of 20 to 35% based on the total volume of the mixture. Specifically, the inert gas may be fed in a volume of 20 to 30% based on the total volume of the mixture.

The mixture may further comprise a reaction rate controlling agent, and the reaction rate controlling agent may be at least one selected from the group consisting of a tertiary amine-based compound and an organometallic compound. Specifically, the reaction rate controlling agent may be a reaction promoter or a reaction retarder. More specifically, the reaction rate controlling agent may be a reaction promoter.

For example, the reaction rate controlling agent may comprise at least one selected from the group consisting of triethylene diamine (TEDA), dimethyl ethanol amine (DMEA), tetramethyl butane diamine (TMBDA), 2-methyl-triethylene diamine, dimethyl cyclohexyl amine (DMCHA), triethyl amine (TEA), triisopropanol amine (TIPA), 1,4-diazabicyclo(2,2,2)octane, bis(2-methylaminoethyl) ether, trimethylaminoethylethanol amine, N,N,N,N,N''-pentamethyldiethylene triamine, dimethylaminoethyl amine, dimethylaminopropyl amine, benzyldimethyl amine, N-ethyl-morpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may be at least one selected from the group consisting of benzyldimethyl amine, N,N-dimethylcyclohexyl amine, and triethylamine.

The reaction rate controlling agent may be employed in an amount of 0.1 to 2 parts by weight based on 100 parts by weight of the urethane-based prepolymer. Specifically, the reaction rate controlling agent may be employed in an amount of 0.2 to 1.8 parts by weight, 0.2 to 1.7 parts by weight, 0.2 to 1.6 parts by weight, or 0.2 to 1.5 parts by weight, based on 100 parts by weight of the urethane-based prepolymer. If the reaction rate controlling agent is employed in an amount within the above range, the reaction rate (i.e., time for solidification) of the mixture (i.e., a mixture of the urethane-based prepolymer, the curing agent, the solid phase foaming agent, the reaction rate controlling agent, and a silicone surfactant) is properly controlled, so that a polishing pad having pores of a desired size can be produced.

The mixture may further comprise a surfactant. The surfactant may act to prevent the pores to be formed from overlapping and coalescing with each other. Specifically, the surfactant is preferably a silicone-based nonionic surfactant. But other surfactants may be variously selected depending on the physical properties required for the polishing pad.

As the silicone-based nonionic surfactant, a silicone-based nonionic surfactant having a hydroxyl group may be used alone or in combination with a silicone-based nonionic surfactant having no hydroxyl group.

The silicone-based nonionic surfactant having a hydroxyl group is not particularly limited as long as it is widely used in the polyurethane technology industry since it is excellent in compatibility with an isocyanate-containing compound and an active hydrogen compound. Examples of the silicone-based nonionic surfactant having a hydroxyl group, which is the commercially available, include DOW CORNING 193 (a silicone glycol copolymer in a liquid phase having a specific gravity at 25° C. of 1.07, a viscosity at 20° C. of 465 mm$^2$/s, and a flash point of 92° C.) (hereinafter referred to as DC-193) manufactured by Dow Corning.

Examples of the silicone-based nonionic surfactant having no hydroxyl group, which is the commercially available, include DOW CORNING 190 (a silicone glycol copolymer having a Gardner color number of 2, a specific gravity at 25° C. of 1.037, a viscosity at 25° C. of 2,000 mm$^2$/s, a flash point of 63° C. or higher, and an inverse solubility point (1.0% water solution) of 36° C. (hereinafter referred to as DC-190) manufactured by Dow Corning.

The surfactant may be employed in an amount of 0.2 to 2 parts by weight based on 100 parts by weight of the urethane-based prepolymer. Specifically, the surfactant may be employed in an amount of 0.2 to 1.9 parts by weight, 0.2 to 1.8 parts by weight, 0.2 to 1.7 parts by weight, 0.2 to 1.6 parts by weight, or 0.2 to 1.5 parts by weight, based on 100 parts by weight of the urethane-based prepolymer. If the amount of the surfactant is within the above range, pores derived from the gas phase foaming agent can be stably formed and maintained in the mold.

As an example, the urethane-based prepolymer, the curing agent, the solid phase foaming agent, the reaction rate controlling agent, the surfactant, and the inert gas can be put into the mixing process substantially at the same time.

As another example, the urethane-based prepolymer, the solid phase foaming agent, and the surfactant may be mixed in advance, and the curing agent, the reaction rate controlling agent, and the inert gas may be subsequently introduced.

The mixing initiates the reaction of the urethane-based prepolymer and the curing agent by mixing them and uniformly disperses the solid phase foaming agent and the inert gas in the raw materials. In such event, the reaction rate controlling agent may intervene in the reaction between the urethane-based prepolymer and the curing agent from the beginning of the reaction, to thereby control the reaction rate. Specifically, the mixing may be carried out at a rate of 1,000 to 10,000 rpm or 4,000 to 7,000 rpm. Within the above speed range, it may be more advantageous for the inert gas and the solid phase foaming agent to be uniformly dispersed in the raw materials.

The urethane-based prepolymer and the curing agent may be mixed at a molar equivalent ratio of 1:0.8 to 1.2, or a molar equivalent ratio of 1:0.9 to 1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed per unit time in amounts satisfying the molar equivalent ratio exemplified above.

Reaction and Formation of Pores

The urethane-based prepolymer and the curing agent react with each other upon the mixing to form a solid polyurethane, which is then formed into a sheet or the like.

Specifically, the isocyanate terminal group in the urethane-based prepolymer can react with the amine group, the alcohol group, and the like in the curing agent. In such event, the inert gas and the solid phase foaming agent are uniformly dispersed in the raw materials to form pores without participating in the reaction between the urethane-based prepolymer and the curing agent.

In addition, the reaction rate controlling agent adjusts the diameter of the pores by promoting or retarding the reaction between the urethane-based prepolymer and the curing agent. For example, if the reaction rate controlling agent is a reaction retarder for delaying the reaction, the time for which the inert gas finely dispersed in the raw materials are combined with each other is prolonged, so that the average diameter of the pores can be increased. On the other hand, if the reaction rate controlling agent is a reaction promoter for expediting the reaction, the time for which the inert gas finely dispersed in the raw materials are combined with each other is shortened, so that the average diameter of the pores can be reduced.

Molding

The molding is carried out using a mold. Specifically, the raw materials (i.e., a mixture comprising the urethane-based prepolymer, the curing agent, and the solid phase foaming agent) sufficiently stirred in a mixing head or the like may be injected into a mold to fill the inside thereof.

The mixture is cured to produce a molded body in the form of a solidified cake. Specifically, the reaction between the urethane-based prepolymer and the curing agent is completed in the mold, so that a molded body in the form of a solidified cake that conforms to the shape of the mold can be obtained.

Thereafter, the molded body thus obtained can be appropriately sliced or cut into a sheet for the production of a polishing pad. As an example, a molded body is prepared in a mold having a height of 5 to 50 times the thickness of a polishing pad to be finally produced and is then sliced in the same thickness to produce a plurality of sheets for the polishing pads at a time. In such event, a reaction retarder may be used as a reaction rate controlling agent in order to secure a sufficient solidification time. Thus, the height of the mold may be about 5 to about 50 times the thickness of the polishing pad finally produced to prepare sheets therefor. However, the sliced sheets may have pores of different diameters depending on the molded location inside the mold. That is, a sheet molded at the lower position of the mold has pores of a fine diameter, whereas a sheet molded at the upper position of the mold may have pores of a larger diameter than that of the sheet formed at the lower position.

Therefore, it is preferable to use a mold capable of producing one sheet by one molding in order for each sheet to have pores of a uniform diameter. To this end, the height of the mold may not significantly differ from the thickness of the porous polyurethane polishing pad to be finally produced. For example, the molding may be carried out using a mold having a height of 1 to 3 times the thickness of the porous polyurethane polishing pad to be finally produced. More specifically, the mold may have a height of 1.1 to 2.5 times, or 1.2 to 2 times, the thickness of the polishing pad to be finally produced. In such event, a reaction promoter may be used as the reaction rate controlling agent to form pores having a more uniform diameter.

Thereafter, the top and bottom ends of the molded body obtained from the mold can be cut out, respectively. For example, each of the top and bottom ends of the molded body may be cut out by ⅓ or less, 1/22 to 3/10, or 1/12 to ¼ of the total thickness of the molded body.

As a specific example, the molding is carried out using a mold having a height of 1.2 to 2 times the thickness of the porous polyurethane polishing pad to be finally produced, and a further step of cutting out each of the top and bottom ends of the molded body obtained from the mold upon the molding by 1/12 to ¼ of the total thickness of the molded body may then be carried out.

Subsequent to the cutting step, the above manufacturing process may further comprise the steps of machining grooves on the surface of the molded body, bonding with the lower part, inspection, packaging, and the like. These steps may be carried out in a conventional manner for preparing a polishing pad.

The process for preparing a porous polyurethane polishing pad according to one embodiment can control the polishing performance (or polishing rate) of the polishing pad by adjusting the size and distribution of pores in the polishing pad thus produced.

In addition, the present invention provides a porous polyurethane polishing pad produced according to the process as described above. Specifically, the porous polyurethane polishing pad comprises a urethane-based prepolymer and a curing agent, and has a thickness of 1.5 to 2.5 mm, an average pore diameter of 10 to 40 μm, a specific gravity of 0.7 to 0.9 g/cm$^3$, a surface hardness at 25° C. of 50 to 65 Shore D, a tensile strength of 15 to 25 N/mm$^2$, an elongation of 80 to 250%, a total area of pores of 30 to 60% based on the total area of the polishing pad, and a breakdown voltage of 14 to 23 kV.

Specifically, the porous polyurethane polishing pad may have a breakdown voltage of 14 to 22 kV.

The kind and amount of the urethane-based prepolymer and the curing agent are the same as described in the above manufacturing process.

Specifically, the porous polyurethane polishing pad may have a breakdown voltage of 14 to 22 kV. Also, the porous polyurethane polishing pad may further comprise a reaction rate controlling agent and may comprise first pores and second pores having different sizes from each other. In an example, the porous polyurethane polishing pad may comprise first pores formed from a solid phase foaming agent and second pores formed from an inert gas. The average diameter of the first pores may be substantially the same as the average particle diameter of the solid phase foaming agent.

The diameter of the second-first pores, which occupy 5 to 45% of the total area of the second pores, may be smaller than the average diameter of the first pores by 5 μm or more, and the diameter of the second-second pores may be larger than the average diameter of the first pores by 5 μm or less.

The kind and amount of the reaction rate controlling agent are the same as described in the above manufacturing process.

The porous polyurethane polishing pad is made of a polyurethane resin, and the polyurethane resin may be derived from a urethane-based prepolymer having an isocyanate terminal group. In such event, the polyurethane resin comprises a monomer unit constituting the urethane-based prepolymer.

The polyurethane resin may have a weight average molecular weight of 500 to 3,000 g/mol. Specifically, the polyurethane resin may have a weight average molecular weight (Mw) of 600 to 2,000 g/mol or 700 to 1,500 g/mol.

The porous polyurethane polishing pad has a thickness of 1.5 to 2.5 mm. Specifically, the porous polyurethane polishing pad may have a thickness of 1.8 to 2.5 mm. If the thickness of the polishing pad is within the above range, the basic physical properties as a polishing pad can be sufficiently exhibited.

The porous polyurethane polishing pad may have grooves on its surface for mechanical polishing. The grooves may have a depth, a width, and a spacing as desired for mechanical polishing, which are not particularly limited.

The porous polyurethane polishing pad has pores of an appropriate size distribution, and the pores are uniformly distributed throughout the polishing pad to provide the average pore diameter, specific gravity, surface hardness, tensile strength, elongation, and breakdown voltage characteristics as described above. That is, the polishing pad has pores of a relatively large pore diameter uniformly arranged and small pores arranged between the large pores. Thus, the polishing pad has a structure in which void spaces formed by the pores and a polyurethane matrix are uniformly distributed. As a result, the polishing pad hardly has a region having a lot of pores and a region having almost no pores. Thus, the polishing pad can prevent scratches or the like that may be generated on a polished object such as a wafer.

The porous polyurethane polishing pad according to one embodiment may be one whose pore size and distribution are adjusted to control the polishing performance (or the polishing rate).

MODE FOR THE INVENTION

Hereinafter, the present invention is explained in detail by the following Examples. However, these examples are set forth to illustrate the present invention, and the scope of the present invention is not limited thereto.

Example 1: Preparation of a Porous Polyurethane Polishing Pad 1-1: Configuration of the Device In a casting machine equipped with feeding lines for a urethane-based prepolymer, a curing agent, an inert gas, and a reaction rate controlling agent, PUGL-550D (manufactured by SKC with a weight average molecular weight of 1,200 g/mol) having an unreacted NCO content of 9.1% by weight was charged in the prepolymer tank, and bis(4-amino-3-chlorophenyl)methane (manufactured by Ishihara) was charged in the curing agent tank. Nitrogen ($N_2$) as an inert gas and a reaction promoter (a tertiary amine compound manufactured by Air Products under the brand name of A1) as a reaction rate controlling agent were prepared. In addition, 2 parts by weight of a solid phase foaming agent (manufactured by AkzoNobel under the brand name of Expancel 461 DET 20 d40 with an average particle diameter of 20 μm) and 1 part by weight of a silicone surfactant (manufactured by Evonik under the brand name of B8462) were mixed in advance based on 100 parts by weight of the urethane-based prepolymer and then charged into the prepolymer tank.

1-2: Preparation of a Sheet

The urethane-based prepolymer, the curing agent, the solid phase foaming agent, the reaction rate controlling agent, and the inert gas were stirred while they were fed to the mixing head at constant speeds through the respective feeding lines. In such event, the molar equivalent ratio of the NCO group in the urethane-based prepolymer to the reactive groups in the curing agent were adjusted to 1:1, and the total feeding amount was maintained at a rate of 10 kg/min. In addition, the inert gas was constantly fed in a volume of 30% based on the total volume of the urethane-based prepolymer, the curing agent, the solid phase foaming agent, the reaction rate controlling agent, and the silicone surfactant. The reaction rate controlling agent was fed in an amount of 1 part by weight based on 100 parts by weight of the urethane-based prepolymer.

The mixed raw materials were injected into a mold (having a width of 1,000 mm, a length of 1,000 mm, and a height of 3 mm) and solidified to obtain a sheet. Thereafter, the surface of the sheet was ground using a grinder and then grooved using a tip, to thereby prepare a porous polyurethane polishing pad having an average thickness of 2 mm.

Example 2

A porous polyurethane polishing pad having an average thickness of 2 mm was prepared in the same manner as in Example 1, except that the inert gas was constantly fed in a volume of 25% based on the total volume of the urethane-based prepolymer, the curing agent, the solid phase foaming agent, the reaction rate controlling agent, and the silicone surfactant.

Comparative Example 1

A porous polyurethane polishing pad was prepared in the same manner as in Example 1, except that no solid phase foaming agent was used and that the inert gas was constantly fed in a volume of 35% based on the total volume of the urethane-based prepolymer, the curing agent, the reaction rate controlling agent, and the silicone surfactant.

Comparative Example 2

A porous polyurethane polishing pad was prepared in the same manner as in Example 1, except that the inert gas was constantly fed in a volume of 17% based on the total volume of the urethane-based prepolymer, the curing agent, the solid phase foaming agent, the reaction rate controlling agent, and the silicone surfactant.

Test Example

The properties of the polishing pads prepared in the Examples and the Comparative Examples were measured according to the following conditions and procedures. The results are shown in Table 1 below and FIGS. 1 to 4.

(1) Hardness

The Shore D hardness was measured. The polishing pad was cut into a size of 2 cm×2 cm (in a thickness of about 2 mm) and then allowed to stand for 16 hours under the conditions of a temperature of 23° C., 30° C., 50° C., and 70° C. and a humidity of 50±5%. Thereafter, the hardness of the polishing pad was measured using a hardness meter (D-type hardness meter).

(2) Specific Gravity

The polishing pad was cut into a rectangle of 4 cm×8.5 cm (in a thickness of 2 mm) and then allowed to stand for 16 hours under the conditions of a temperature of 23±2° C. and a humidity of 50±5%. The specific gravity of the polishing pad was measured using a gravimeter.

(3) Tensile Strength

The ultimate strength immediately before the fracture was measured while the polishing pad was tested at a rate of 50 mm/min using a universal testing machine (UTM).

(4) Elongation

The test was carried out in the same manner as the tensile strength measurement. The maximum deformation amount immediately before the fracture was measured, and the ratio of the maximum deformation amount to the initial length was expressed in a percentage (%).

(5) Average Pore Diameter, Ratio of Pore Area, and Number of Pores

The polishing pad was cut into a square of 2 cm×2 cm (in a thickness of 2 mm) and observed with a scanning electron microscope (SEM) at a magnification of 100 times. An image was obtained using an image analysis software, and the diameters of the entire pores were measured from the image, from which the average pore diameter, the number of pores per unit area, the ratio of pore area, and the pore size distribution were calculated. The SEM photographs of Examples 1, 2 and Comparative Example 1 are shown in FIGS. 1 to 3, respectively. The pore size distribution thus calculated is shown in FIG. 4.

(6) Breakdown Voltage

The breakdown voltage of 10 points was measured using SM-100BDV (model name) and 100 kV Brake Down Voltage Tester (instrument name) from SMEM Instruments, and the average value thereof was calculated.

Specifically, the 10 points mentioned above were selected as points in an interval of a width of 4 mm and a length of 4 mm on a square of 2 cm×2 cm (in a thickness of 2 mm) of the polishing pad.

(7) Polishing Rate of Silicon Oxide ($SiO_x$)

A silicon wafer having a diameter of 300 mm with a silicon oxide film formed by a TEOS-plasma CVD method was set on the porous polyurethane polishing pad mounted on the platen in a CMP polishing machine, while the silicon oxide film of the silicon wafer faced downward. Thereafter, the silicon oxide film was polished under a polishing load of 1.4 psi while the silicon wafer was rotated at a speed of 121 rpm, the platen was rotated at a speed of 115 rpm for 60 seconds, and a calcined silica slurry was supplied on the polishing pad at a rate of 190 ml/min. Upon completion of the polishing, the silicon wafer was detached from the carrier, mounted in a spin dryer, washed with purified water (DIW), and then dried with air for 15 seconds. The film thickness of the dried silicon wafer was measured before and after the polishing using a spectral reflectometer type thickness measuring instrument, and the polishing rate was calculated therefrom. The polishing rates of the Examples and the Comparative Examples were calculated based on the polishing rate of Example 2 as 100%.

TABLE 1

|  | C. Ex. 1 | C. Ex. 2 | Ex. 1 | Ex. 2 |
| --- | --- | --- | --- | --- |
| Specific gravity (g/cm$^3$) | 0.817 | 0.90 | 0.801 | 0.812 |
| Hardness at 25° C. (Shore D) | 58 | 65 | 58 | 59 |
| Hardness at 30° C./50° C./70° C. (Shore D) | 58/53/49 | 63/60/56 | 57/53/46 | 59/55/49 |
| Tensile strength (N/mm$^2$) | 22.4 | 22.8 | 21.1 | 21.0 |
| Elongation (%) | 190 | 76.3 | 185 | 180 |
| Average pore size (μm) | 49.5 | 14.4 | 21.4 | 15.0 |
| Ratio of pore area (%) | 45.5 | 38.8 | 41.7 | 40.7 |
| Number of pores (a width of 2 cm × a length of 2 cm × a height of 2 cm) | 78 | 399 | 258 | 411 |
| Breakdown voltage (kV) | 13 | 23.3 | 17.5 | 21.2 |
| Polishing rate of silicon oxide ($SiO_x$) (%) | 55 | 65 | 80 | 100 |

As shown in Table 1, the polishing pads of Examples 1 and 2 had smaller average pore sizes and larger numbers of pores per unit area than those of the polishing pad of Comparative Example 1. Thus, they had high breakdown voltages and polishing rates of silicon oxide. In addition, the polishing pads of Examples 1 and 2 had higher elongations than the polishing pad of Comparative Example 2 and appropriate breakdown voltages. Thus, they had high polishing rates of silicon oxide.

The invention claimed is:

1. A porous polyurethane polishing pad, which is prepared from a reaction mixture comprising a urethane-based prepolymer and a curing agent, and has a thickness of 1.5 to 2.5 mm, an average pore diameter of 10 to 40 μm, a specific gravity of 0.7 to 0.9 g/cm$^3$, a surface hardness at 25° C. of 50 to 65 Shore D, a tensile strength of 15 to 25 N/mm$^2$, an elongation of 80 to 250%, a total area of pores of 30 to 60% based on the total area of the polishing pad, and a breakdown voltage of 14 to 23 kV,
wherein the reaction mixture further comprises one or more solid phase foaming agents in an amount of 0.5 to 10 parts by weight based on 100 parts by weight of the urethane-based prepolymer,
wherein the porous polyurethane polishing pad has first pores and second pores, the second pores comprise second-first pores and second-second pores, and
wherein the diameter of second-first pores, which occupy 5 to 45% of the total area of the second pores, is smaller than the average diameter of the first pores by 5 μm or more, and the diameter of second-second pores, which occupy 5 to 45% of the total area of the second pores, is larger than the average diameter of the first pores by 5 μm or less.

2. The porous polyurethane polishing pad of claim 1, wherein the one or more solid phase foaming agents have an average particle diameter of 10 to 50 μm, and the porous polyurethane polishing pad has a breakdown voltage of 14 to 22 kV.

3. The porous polyurethane polishing pad of claim 1, wherein the reaction mixture further comprises a reaction rate controlling agent.

4. The porous polyurethane polishing pad of claim 3, wherein the first pores are formed from the one or more solid phase foaming agents, and the second pores are formed from an inert gas.

5. The porous polyurethane polishing pad of claim 3, wherein the one or more solid phase foaming agents comprise a first solid phase foaming agent and a second solid phase foaming agent, and
wherein the first pores are formed from the first solid phase foaming agent and the second pores are formed from the second solid phase foaming agent having an average particle diameter different from that of the first solid phase foaming agent.

6. The porous polyurethane polishing pad of claim 3, wherein the reaction rate controlling agent comprises at least one selected from the group consisting of triethylene diamine, dimethyl ethanol amine, tetramethyl butane diamine, 2-methyl-triethylene diamine, dimethyl cyclohexyl amine, triethyl amine, triisopropanol amine, bis(2-methyl-aminoethyl) ether, trimethylaminoethylethanol amine, N,N,N',N'-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin bis (lauryl mercaptide).

7. The porous polyurethane polishing pad of claim 1, wherein the urethane-based prepolymer is prepared by reacting an isocyanate compound with a polyol, and the curing agent comprises at least one selected from the group consisting of an amine compound and an alcohol compound.

8. A process for preparing a porous polyurethane polishing pad, which comprises:
(1) injecting a mixture comprising a urethane-based prepolymer, a curing agent, and one or more solid phase foaming agents into a mold and molding the mixture; and
(2) curing the mixture,
wherein the one or more solid phase foaming agents are employed in an amount of 0.5 to 10 parts by weight based on 100 parts by weight of the urethane-based prepolymer, and
the porous polyurethane polishing pad has a thickness of 1.5 to 2.5 mm, an average pore diameter of 10 to 40 μm, a specific gravity of 0.7 to 0.9 g/cm$^3$, a surface hardness at 25° C. of 50 to 65 Shore D, a tensile strength of 15 to 25 N/mm$^2$, an elongation of 80 to 250%, a total area of pores of 30 to 60% based on the total area of the polishing pad, and a breakdown voltage of 14 to 23 kV, wherein the porous polyurethane polishing pad has first pores and second pores, the second pores comprise second-first pores and second-second pores, and wherein the diameter of second-first pores, which occupy 5 to 45% of the total area of the second pores, is smaller than the average diameter of the first pores by 5 μm or more, and the diameter of second-second pores, which occupy 5 to 45% of the total area of the second pores, is larger than the average diameter of the first pores by 5 μm or less.

9. The process for preparing a porous polyurethane polishing pad of claim 8, wherein, in the step (1), an inert gas is fed into the mold when the mixture is injected into the mold, and the inert gas is fed in a volume of 20 to 35% based on the total volume of the mixture.

10. The process for preparing a porous polyurethane polishing pad of claim 9, wherein the mixture further comprises a reaction rate controlling agent, and the reaction rate controlling agent is at least one selected from the group consisting of a tertiary amine-based compound and an organometallic compound.

11. The process for preparing a porous polyurethane polishing pad of claim 10, wherein the reaction rate controlling agent comprises at least one selected from the group consisting of triethylene diamine, dimethyl ethanol amine, tetramethyl butane diamine, 2-methyl-triethylene diamine, dimethyl cyclohexyl amine, triethyl amine, triisopropanol amine, bis(2-methylaminoethyl) ether, trimethylaminoethylethanol amine, N,N,N,N,N"-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin bis (lauryl mercaptide).

* * * * *